United States Patent
Miki

(10) Patent No.: US 10,630,263 B2
(45) Date of Patent: Apr. 21, 2020

(54) RESONATOR CIRCUIT

(71) Applicant: Takashi Miki, Hyogo (JP)

(72) Inventor: Takashi Miki, Hyogo (JP)

( * ) Notice: Subject to any disclaimer, the term of this patent is extended or adjusted under 35 U.S.C. 154(b) by 0 days.

(21) Appl. No.: 16/357,936

(22) Filed: Mar. 19, 2019

(65) Prior Publication Data

US 2019/0305757 A1 Oct. 3, 2019

Related U.S. Application Data

(60) Provisional application No. 62/761,500, filed on Mar. 27, 2018.

(51) Int. Cl.
*H03L 5/00* (2006.01)
*H03H 9/02* (2006.01)
*H03H 9/24* (2006.01)
*H03H 11/04* (2006.01)
*H03M 3/00* (2006.01)

(52) U.S. Cl.
CPC ........ *H03H 11/0422* (2013.01); *H03M 3/458* (2013.01)

(58) Field of Classification Search
CPC ............................ H03H 11/0422; H03M 3/458
See application file for complete search history.

(56) References Cited

U.S. PATENT DOCUMENTS

| 10,312,185 B2 * | 6/2019 | Bahr | ............... H01L 23/49541 |
| 2014/0266828 A1 | 9/2014 | Matsukawa et al. | |

OTHER PUBLICATIONS

Young-Kyun Cho et al., "Single op-amp second-order loop filter for continuous-time delta-sigma modulators", Electronics Letters, Apr. 16, 2015, vol. 51, No. 8, pp. 619-621.

Kevin Dobson et al., "A 6th Order Continuous Time Band-Pass Sigma Delta Analog to Digital Modulator with Active Inductor based Resonators", Department of Electrical and Computer Engineering George Washington University, Nashington DC, USA, 2013 IEEE 56th International Midwest Symposium on Circuits and Systems (MWSCAS) pp. 281-284.

Yue Wu, Xiaohui Ding et al., "RF Bandpass Filter Design Based on CMOS Active Inductors", IEEE Transactions on Circuits and Systems—II: Analog and Digital Signal Processing, vol. 50, No. 12, Dec. 2003, pp. 942-949.

Marcello De Matteis et al., "A Biquadratic Cell Based on the Flipped-Source-Follower Circuit", IEEE Transactions on Circuits and Systems—II: Express Briefs, vol. 64, No. 8, pp. 867-871, Aug. 2017.

* cited by examiner

*Primary Examiner* — Kenneth B Wells
(74) *Attorney, Agent, or Firm* — IP Business Solutions, LLC

(57) ABSTRACT

A resonator circuit has first to sixth transconductance units and the first to fourth connectors. The first transconductance unit has the first top, bottom, and control terminals. The second transconductance unit has the second top terminal connected to the first bottom terminal and has the second bottom and control terminals. The third transconductance unit has a third top terminal connected to the first top terminal and has the third bottom and control terminals. The fourth transconductance unit has the fourth top, bottom, and control terminals. The fifth transconductance unit has the fifth top terminal connected to the fourth bottom terminal and has the fifth bottom and control terminals. The sixth transconductance unit has the sixth top terminal connected to the fourth top terminal and has the sixth bottom and control terminals.

2 Claims, 5 Drawing Sheets

RESONATOR CIRCUIT

CROSS-REFERENCE TO THE RELATED APPLICATION

This Non-Provisional Application claims priority to Provisional Application No. 62/761,500 filed on Mar. 27, 2018. The entire content of Provisional Application No. 62/761,500 is incorporated herein by reference.

BACKGROUND OF THE INVENTION

A resonator has a frequency response in which a sharp peak at a specific frequency appears in the amplitude of its transfer function. The high gain at a specific frequency makes a resonator useful for a sigma-delta type analog to digital converter (ADC). How to design resonators using an opamp or opamps has been proposed in applications for sigma-delta type ADCs. The speed at which these types of ADCs can work is determined mostly by the bandwidth of those resonators, which is in turn the bandwidth of opamps in the resonators. Opamps of high speed consume more power than those of low speed, and this is one of the reasons why high speed sigma-delta ADCs using resonators consume a lot of power.

SUMMARY

A resonator circuit has first to sixth transconductance units and first to fourth connectors. The first transconductance unit has a first top terminal, a first bottom terminal, and a first control terminal, and is configured to change the current flowing from the first top terminal to the first bottom terminal substantially in proportion to the change of the voltage of the first control terminal with respect to the first bottom terminal. The second transconductance unit has a second top terminal connected to the first bottom terminal to form a first output node, a second bottom terminal, and a second control terminal, and is configured to change the current flowing from the second top terminal to the second bottom terminal substantially in proportion to the change of the voltage of the second control terminal with respect to the second bottom terminal. The third transconductance unit has a third top terminal connected to the first top terminal to form a first intermediate node, a third bottom terminal, and a third control terminal, and is configured to change the current flowing from the third top terminal to the third bottom terminal substantially in proportion to the change of the voltage of the third control terminal with respect to the third bottom terminal. The fourth transconductance unit has a fourth top terminal, a fourth bottom terminal, and a fourth control terminal, and is configured to change the current flowing from the fourth top terminal to the fourth bottom terminal substantially in proportion to the change of the voltage of the fourth control terminal with respect to the fourth bottom terminal. The fifth transconductance unit has a fifth top terminal connected to the fourth bottom terminal to form a second output node, a fifth bottom terminal, and a fifth control terminal, and is configured to change the current flowing from the fifth top terminal to the fifth bottom terminal substantially in proportion to the change of the voltage of the fifth control terminal with respect to the fifth bottom terminal. The sixth transconductance unit has a sixth top terminal connected to the fourth top terminal to form a second intermediate node, a sixth bottom terminal, and a sixth control terminal, and is configured to change the current flowing from the sixth top terminal to the sixth bottom terminal substantially in proportion to the change of the voltage of the sixth control terminal with respect to the sixth bottom terminal. The first connector is configured to connect the second control terminal to the first intermediate node. The second connector is configured to connect the fifth control terminal to the second intermediate node. The third connector is configured to connect the third control terminal to the second intermediate node. The fourth connector is configured to connect the sixth control terminal to the first intermediate node.

DETAILED DESCRIPTION OF THE TECHNOLOGY

The First Embodiment

Figure 1:
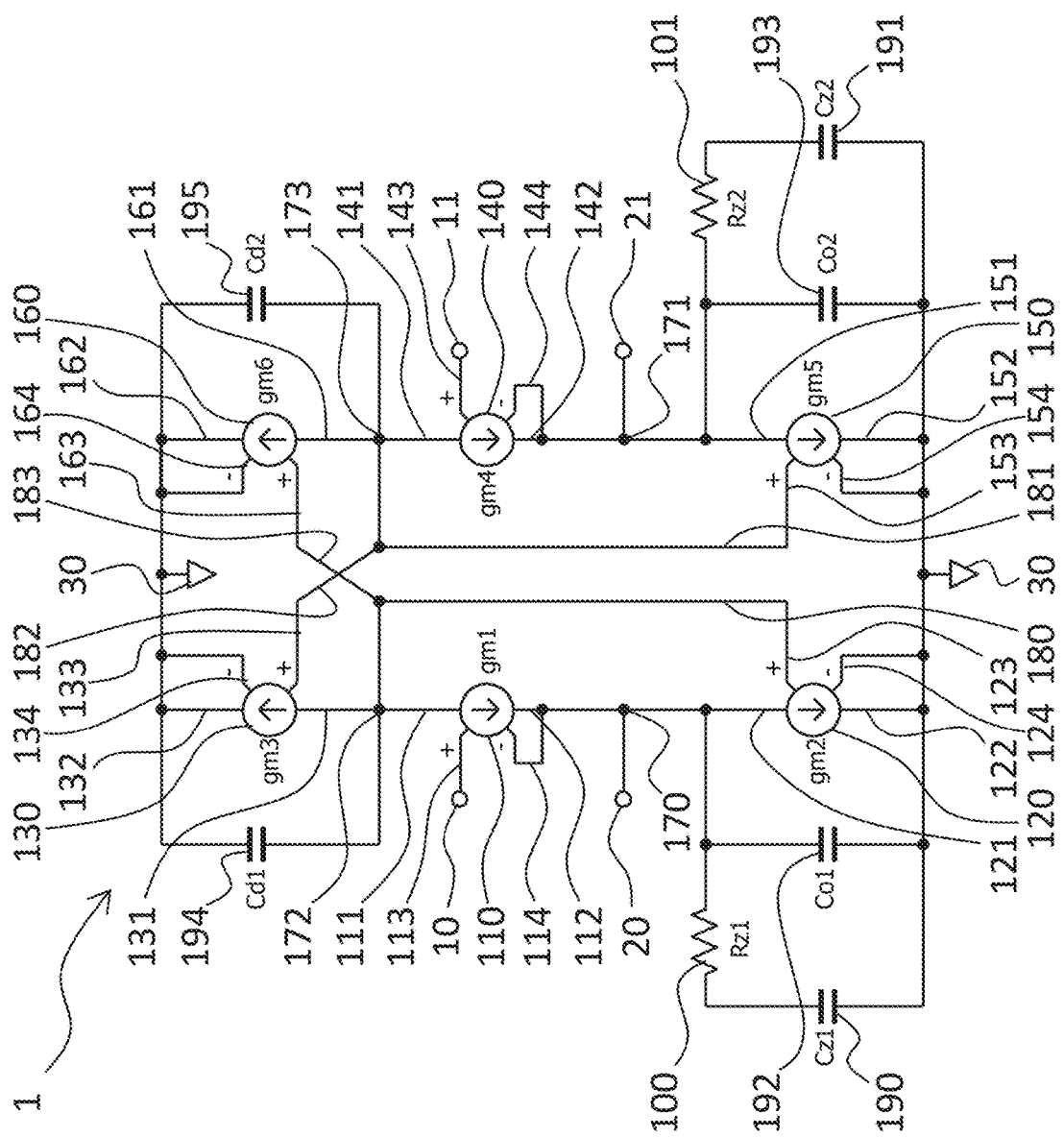
FIG. 1 is a diagram of resonator circuit 1 pertaining to the first embodiment

A resonator circuit 1 in FIG. 1 has the first input terminal 10, the second input terminal 11, the first output terminal 20, the second output terminal 21, the first voltage supply 30 (an example of a virtual ground), a resistor 100 (an example of a first resistive element), a resistor 101 (an example of a second resistive element), the first transconductance unit 110, the second transconductance unit 120, the third transconductance unit 130, the fourth transconductance unit 140, the fifth transconductance unit 150, the sixth transconductance unit 160, the first output node 170, the second output node 171, the first intermediate node 172, the second intermediate node 173, the first connector 180, the second connector 181, the third connector 182, the fourth connector 183, a capacitor 190 (an example of a first capacitive element), a capacitor 191 (an example of a second capacitive element), and capacitors 192, 193, 194, and 195. The first voltage supply 30 is a DC voltage source and can be considered as a virtual ground because its voltage is relatively constant in relation to an AC or differential signal. The first transconductance unit 110 is a voltage controlled current source and has the first top terminal 111, first bottom terminal 112, first control terminal 113, and the first reference terminal 114. The second transconductance unit 120 is a voltage controlled current source and has the second top terminal 121, second bottom terminal 122, second control terminal 123, and the second reference terminal 124. The third transconductance unit 130 is a voltage controlled current source and has the third top terminal 131, third bottom terminal 132, third control terminal 133, and the third reference terminal 134. The fourth transconductance unit 140 is a voltage controlled current source and has the fourth top terminal 141, fourth bottom terminal 142, fourth control terminal 143, and the fourth reference terminal 144. The fifth transconductance unit 150 is a voltage controlled current source and has the fifth top terminal 151, fifth bottom terminal 152, fifth control terminal 153, and the fifth reference terminal 154. The sixth transconductance unit 160 is a voltage controlled current source and has the sixth top terminal 161, sixth bottom terminal 162, sixth control terminal 163, and the sixth reference terminal 164.

The first transconductance unit 110 is configured to change the current flowing from the first top terminal 111 to the first bottom terminal 112 substantially in proportion to the change of the voltage of the first control terminal 113 with respect to the first bottom terminal 112, and the second to sixth transconductance units 120 to 160 are similarly configured. The first to sixth transconductance units 110 to 160 have transconductance gm1 to gm6, respectively. Each of the first to sixth transconductance units 110 to 160 has a current path connecting the top terminal and the bottom terminal, and the current path conducts a current that is proportional to the voltage of its control terminal with respect to the voltage of its reference terminal, and its reference terminal is shorted to its bottom terminal. The product of the corresponding transconductance and the voltage of the control terminal with respect to the voltage of the reference terminal represents the amount of current that flows in the current path between the top and bottom terminals.

The second top terminal 121 is connected to the first bottom terminal 112 to form the first output node 170. The first output terminal 20 is connected to the first output node 170. The third top terminal 131 is connected to the first top terminal 111 to form the first intermediate node 172. The fifth top terminal 151 is connected to the fourth bottom terminal 142 to form the second output node 171. The second output terminal 21 is connected to the second output node 171. The sixth top terminal 161 is connected to the fourth top terminal 141 to form the second intermediate node 173. The first connector 180 is a wire configured to connect the second control terminal 123 to the first intermediate node 172. The second connector 181 is a wire configured to connect the fifth control terminal 153 to the second intermediate node 173. The third connector 182 is a wire configured to connect the third control terminal 133 to the second intermediate node 173. The fourth connector 183 is a wire configured to connect the sixth control terminal 163 to the first intermediate node 172.

The first input terminal 10 is connected to the first control terminal 113, and the second input terminal 11 is connected to the fourth control terminal 143. The second bottom terminal 122, third bottom terminal 132, fifth bottom terminal 152, and the sixth bottom terminal 162 are connected to the first voltage supply 30. The first reference terminal 114 is shorted to the first bottom terminal 112. The second reference terminal 124 is shorted to the second bottom terminal 122. The third reference terminal 134 is shorted to the third bottom terminal 132. The fourth reference terminal 144 is shorted to the fourth bottom terminal 142. The fifth reference terminal 154 is shorted to the fifth bottom terminal 152. The sixth reference terminal 164 is shorted to the sixth bottom terminal 162. Resistor 100 and capacitor 190 are connected in series and connect the first output node 170 to the first voltage supply 30. Resistor 101 and capacitor 191 are connected in series and connect the second output node 171 to the first voltage supply 30. Capacitor 192 connects the first output node 170 to the first voltage supply 30. Capacitor 193 connects the second output node 171 to the first voltage supply 30. Capacitor 194 connects the first intermediate node 172 to the first voltage supply 30. Capacitor 195 connects the second intermediate node 173 to the first voltage supply 30.

Figure 2:
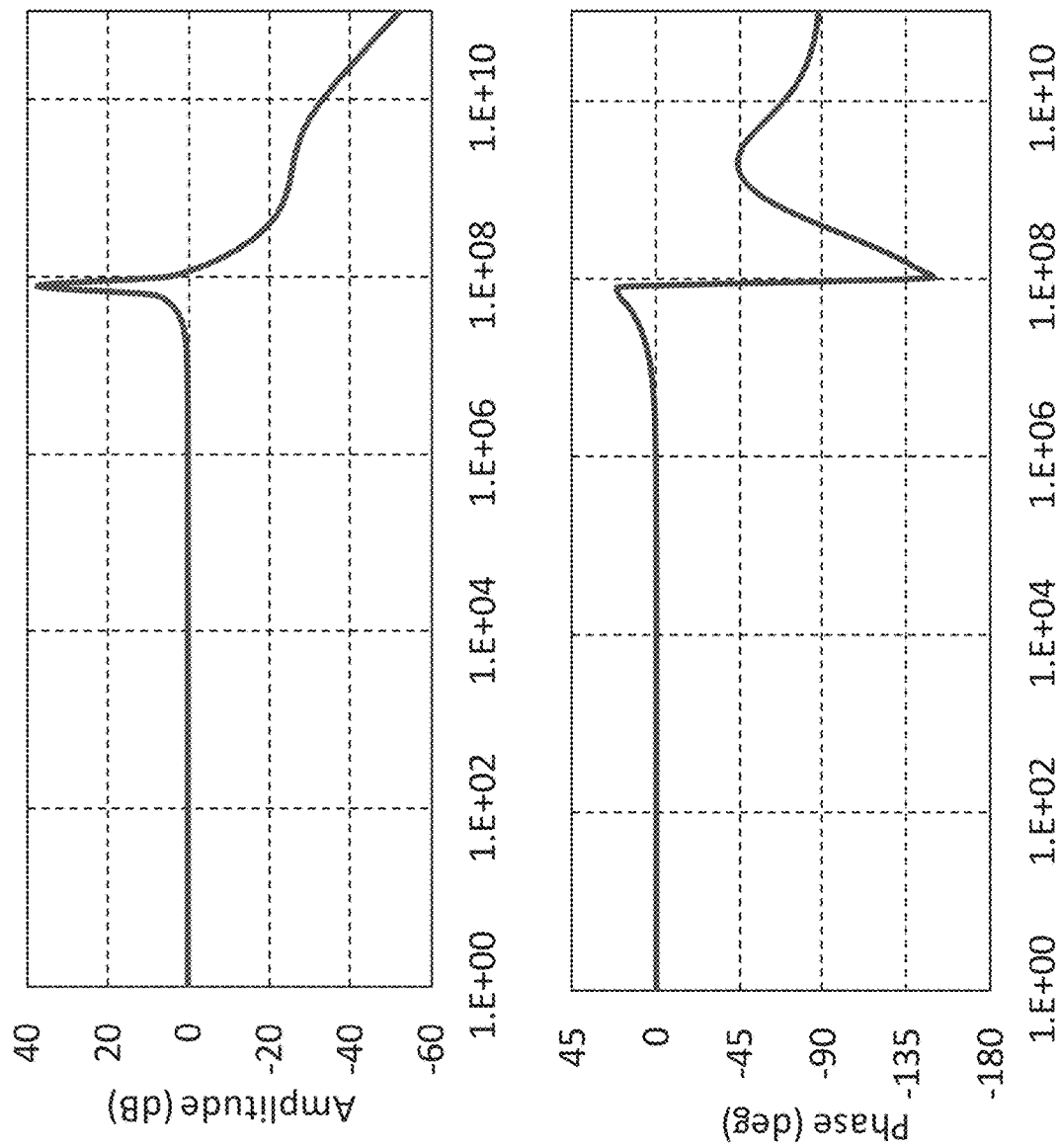
FIG. 2 shows bode plots of resonator circuit 1

An example of the frequency response of resonator circuit 1 is shown in FIG. 2. The bode plots of the differential signal calculated as the difference between the signals from the first and second output terminals 20 and 21 are plotted in FIG. 2 when differential signals are applied to the first and second input terminals 10 and 11 so that the amplitude of the input differential signals is unity. $Rz1$, $Rz2$, $Cz1$, $Cz2$, $Co1$, $Co2$, $Cd1$, and $Cd2$ are the resistance and capacitance of resistors and capacitors 100, 101, 190 to 195, respectively. The bode plots in FIG. 2 are those obtained when $Rz1=Rz2=192\Omega$, $Cz1=Cz2=2.94$ pF, $Co1=Co2=0.2$ pF, $Cd1=Cd2=0.2$ pF, $gm1=gm4=0.3$ mA/V, $gm2=gm5=0.6$ mA/V, and when $gm3=gm6=0.047$ mA/V. This set of values of the components is for a resonance frequency of 80 MHz, two zeros at 282 MHz and 440 MHz, and a pole at 4.6 GHz. The pair of resistor 100 and capacitor 190 and the pair of resistor 101 and capacitor 191 are to provide the second zero. The second zero helps the phase of the transfer function of resonator circuit 1 to drop slowly. Because the third connector 182 connects the third control terminal 133 to the second intermediate node 173 and because the fourth connector 183 connects the sixth control terminal 163 to the first intermediate node 172, positive feedbacks occur around the third and sixth transconductance units 130 and 160. These positive feedbacks make it possible for resonator circuit 1 to meet a condition for resonance.

The Second Embodiment

Figure 3:
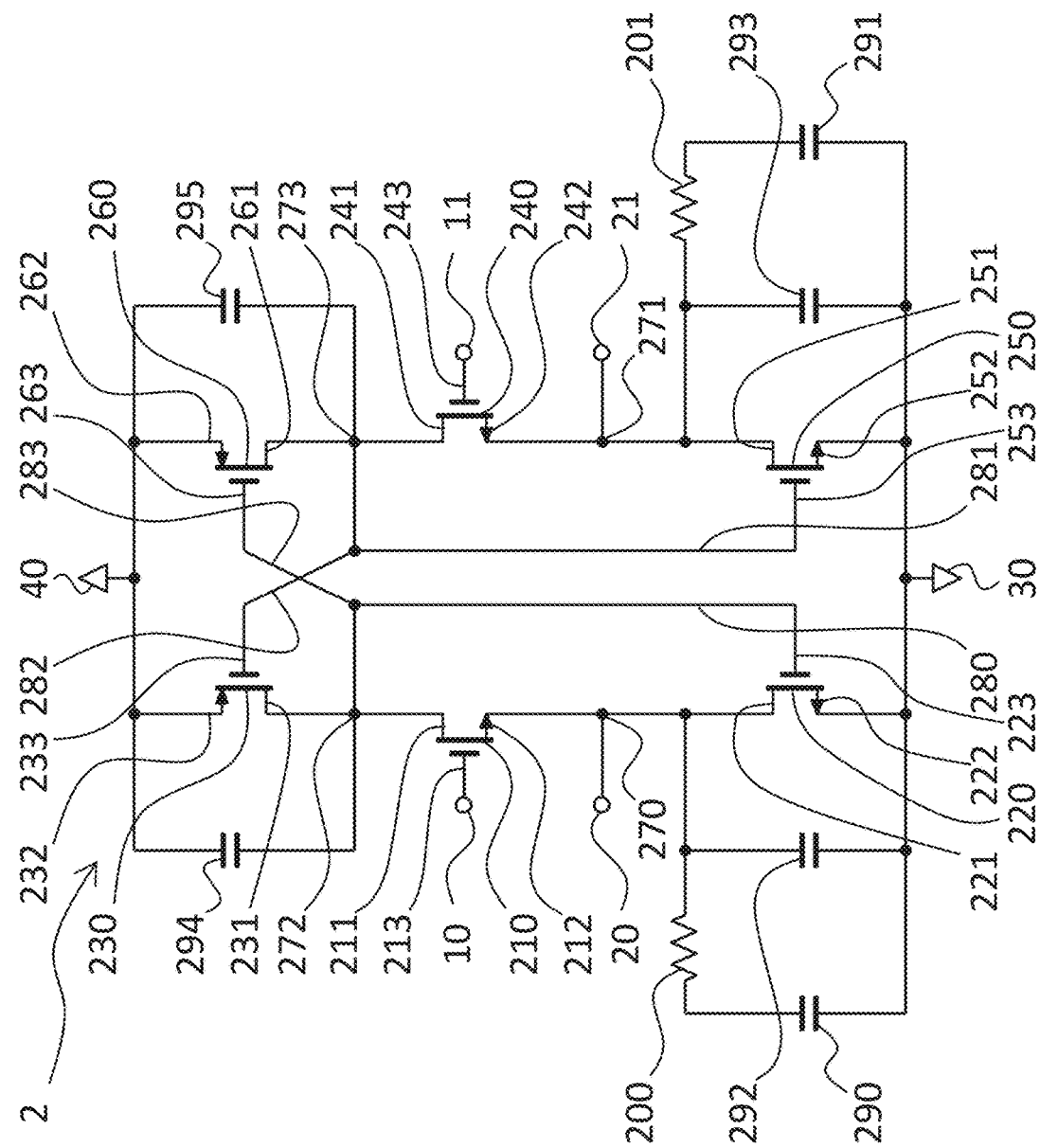
FIG. 3 is a diagram of resonator circuit 2 pertaining to the second embodiment

Resonator circuit 2 in FIG. 3 has the first input terminal 10, the second input terminal 11, the first output terminal 20, the second output terminal 21, the first voltage supply 30 (an example of a virtual ground), the second voltage supply 40, a resistor 200 (an example of a first resistive element), a resistor 201 (an example of a second resistive element), the first transistor 210 (an example of a first transconductance unit), the second transistor 220 (an example of a second transconductance unit), the third transistor 230 (an example of a third transconductance unit), the fourth transistor 240 (an example of a fourth transconductance unit), the fifth transistor 250 (an example of a fifth transconductance unit), the sixth transistor 260 (an example of a sixth transconductance unit), the first output node 270, the second output node 271, the first intermediate node 272, the second intermediate node 273, the first connector 280, the second connector 281, the third connector 282, the fourth connector 283, a capacitor 290 (an example of a first capacitive element), a capacitor 291 (an example of a second capacitive element), and capacitors 292, 293, 294, and 295. The first voltage supply 30 and the second voltage supply 40 are a DC voltage source and can be considered as a virtual ground because their voltages are relatively constant in relation to an AC or differential signal. The first transistor 210 is an NMOS transistor and has the first drain terminal 211 (an example of a first top terminal), the first source terminal 212 (an example of a first bottom terminal), and the first gate terminal 213 (an example of a first control terminal). The second transistor 220 is an NMOS transistor and has the second drain terminal 221 (an example of a second top terminal), the second source terminal 222 (an example of a second bottom terminal), the second gate terminal 223 (an example of a second control terminal). The third transistor 230 is a PMOS transistor and has the third drain terminal 231 (an example of a top terminal), the third source terminal 232 (an example of a third bottom terminal), the third gate terminal 233 (an example of a third control terminal). The fourth transistor 240 is an NMOS transistor and has the fourth drain terminal 241 (an example of a fourth top terminal), the fourth source terminal 242 (an example of a fourth bottom terminal), and the fourth gate terminal 243 (an example of a fourth control terminal). The fifth transistor 250 is an NMOS transistor and has the fifth drain terminal 251 (an example of a fifth top terminal), the fifth source terminal 252 (an example of a fifth bottom terminal), and the fifth gate terminal 253 (an example of a fifth control terminal). The sixth transistor 260 is a PMOS transistor and has the sixth drain terminal 261 (an example of a sixth top terminal), the sixth source terminal 262 (an example of a sixth bottom terminal), and the sixth gate terminal 263 (an example of a sixth control terminal). The first transistor 210 changes the current flowing from the first drain terminal 211 to the first source terminal 212 substantially in proportion to the change of the voltage of the first gate terminal 213 with respect to the first source terminal 212, and the second to sixth transistors 220, 230, 240, 250, and 260 work in the same way.

The second drain terminal 221 is connected to the first source terminal 212 to form the first output node 270. The first output terminal 20 is connected to the first output node 270. The third drain terminal 231 is connected to the first drain terminal 211 to form the first intermediate node 272. The fifth drain terminal 251 is connected to the fourth source terminal 242 to form the second output node 271. The second output terminal 21 is connected to the second output node 271. The sixth drain terminal 261 is connected to the fourth drain terminal 241 to form the second intermediate node 273. The first connector 280 is a wire configured to connect the second gate terminal 223 to the first intermediate node 272. The second connector 281 is a wire configured to connect the fifth gate terminal 253 to the second intermediate node 273. The third connector 282 is a wire configured to connect the third gate terminal 233 to the second intermediate node 273. The fourth connector 283 is a wire configured to connect the sixth gate terminal 263 to the first intermediate node 272.

The first input terminal 10 is connected to the first gate terminal 213, and the second input terminal 11 is connected to the fourth gate terminal 243. Resistor 200 and capacitor 290 are connected in series and connect the first output node 270 to the first voltage supply 30. Resistor 201 and capacitor 291 are connected in series and connect the second output node 271 to the first voltage supply 30. Capacitor 292 connects the first output node 270 to the first voltage supply 30. Capacitor 293 connects the second output node 271 to the first voltage supply 30. Capacitor 294 connects the first intermediate node 272 to the second voltage supply 40. Capacitor 295 connects the second intermediate node 273 to the second voltage supply 40.

The Third Embodiment

Figure 4:
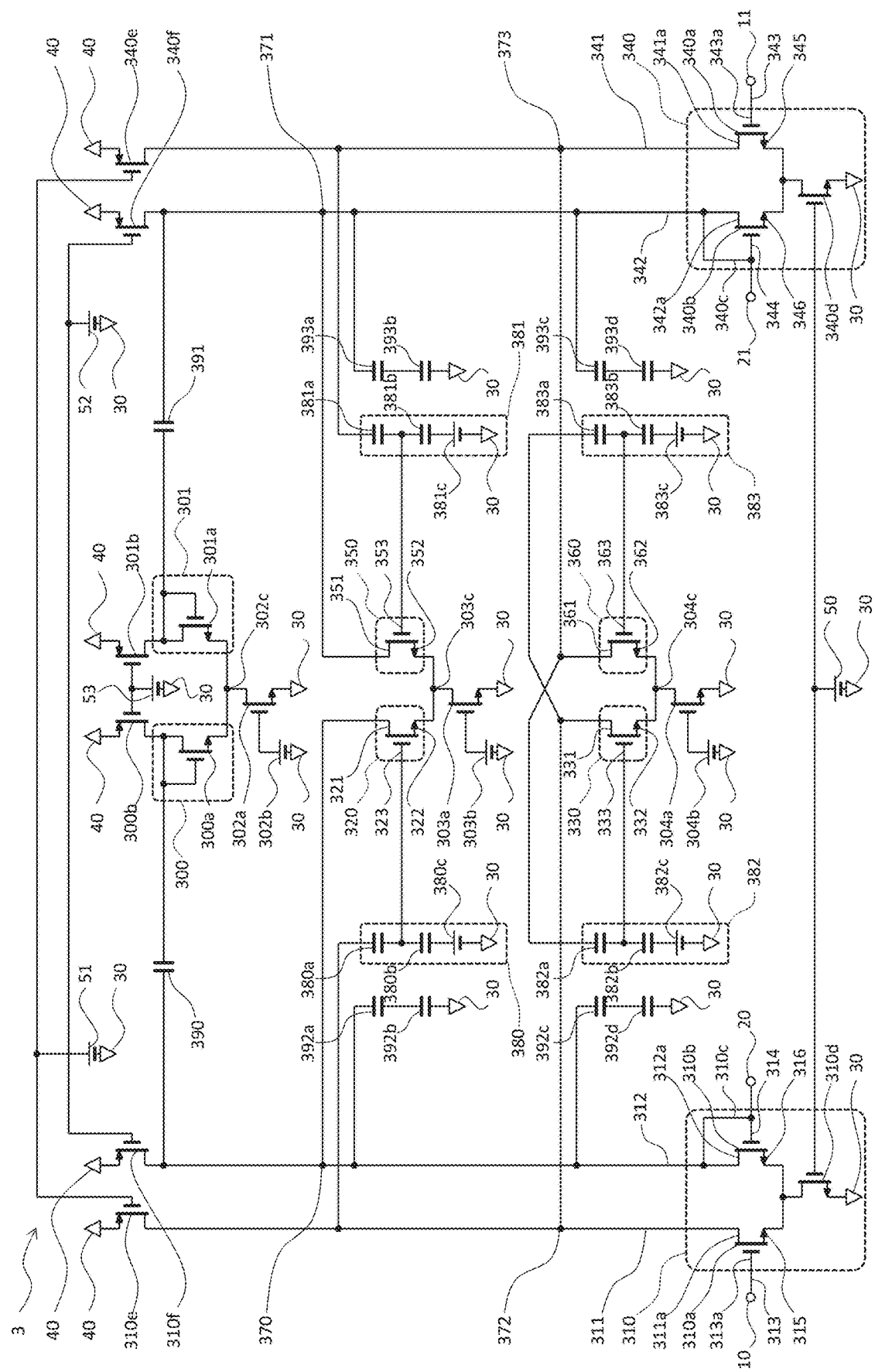
FIG. 4 is a diagram of resonator circuit 3 pertaining to the third embodiment

Resonator circuit 3 in FIG. 4 has the first input terminal 10, the second input terminal 11, the first output terminal 20, the second output terminal 21, the first voltage supply 30, the second voltage supply 40, bias voltage sources 50, 51, 52, and 53, a diode connected transistor 300 (an example of a first resistive element), an active load transistor 300b, a diode connected transistor 301 (an example of a second resistive element), an active load transistor 301b, a current source transistor 302a, a bias voltage source 302b, a node 302c (an example of a virtual ground), a current source transistor 303a, a bias voltage source 303b, a node 303c, a current source transistor 304a, a bias voltage source 304b, a node 304c, a transconductance unit 310 (an example of a first transconductance unit), an active load transistor 310e, an active load transistor 310f, a transistor 320 (an example of a second transconductance unit), a transistor 330 (an example of a third transconductance unit), a transconductance unit 340 (an example of a fourth transconductance unit), an active load transistor 340e, an active load transistor 340f, a transistor 350 (an example of a fifth transconductance unit), a transistor 360 (an example of a sixth transconductance unit), the first output node 370, the second output node 371, the first intermediate node 372, the second intermediate node 373, the first connector 380, the second connector 381, the third connector 382, the fourth connector 383, a capacitor 390 (an example of a first capacitive element), a capacitor 391 (an example of a second capacitive element), capacitors 392a, 392b, 392c, and 392d, and capacitors 393a, 393b, 393c, and 393d. The first voltage supply 30 and the second voltage supply 40 are DC voltage sources.

Transconductance unit 310 has a pair of transistors 310a and 310b (an example of a first pair of transistors), a feedback path 310c (an example of a first feedback path), a current source transistor 310d, the first top terminal 311, the first bottom terminal 312, and the first control terminal 313. Transistors 310a and 310b constitute a differential pair and have matched dimensions. Transistor 310a (an example of one of the first pair of transistors) has a drain terminal 311a (an example of a first input drain terminal) configured to form the first top terminal 311, a gate terminal 313a (an example of a first input gate terminal) configured to form the first control terminal 313, and a source terminal 315. Transistor 310b (an example of the other of the first pair of transistors) has a drain terminal 312a (an example of a first output drain terminal) configured to form the first bottom terminal 312, a gate terminal 314 (an example of a first output gate terminal), and a source terminal 316. Feedback path 310c is a wire connecting drain terminal 312a to gate terminal 314 to feed back a signal from drain terminal 312a to gate terminal 314. Current source transistor 310d is arranged to provide a bias current to transistors 310a and 310b and has a drain terminal to which both of the source terminals of transistors 310a and 310b are connected, a gate terminal to which a bias voltage is applied by bias voltage source 50, and a source terminal connected to the first voltage supply 30. Active load transistor 310e is arranged to provide a bias current to transistors 310a and 330 and has a drain terminal to which both of the drain terminals of transistors 310a and 330 are connected, a gate terminal to which a bias voltage is applied by bias voltage source 51, and a source terminal connected to the second voltage supply 40. Active load transistor 310f is arranged to provide a bias current to transistors 310b and 320 and has a drain terminal to which both of the drain terminals of transistors 310b and 320 are connected, a gate terminal to which a bias voltage is applied by bias voltage source 52, and a source terminal connected to the second voltage supply 40. As depicted so far, the first transconductance unit 310 has a differential pair in which the output signal is fed back to one of its input terminals so that it changes the current flowing from the first top terminal 311 to the first bottom terminal 312 substantially in proportion to the change of the voltage of the first control terminal 313 with respect to the first bottom terminal 312.

Transconductance unit 340 has a pair of transistors 340a and 340b (an example of a second pair of transistors), a feedback path 340c (an example of a second feedback path), a current source transistor 340d, the fourth top terminal 341, the fourth bottom terminal 342, and the fourth control terminal 343. Transistors 340a and 340b constitute a differential pair and have matched dimensions. Transistor 340a (an example of one of the second pair of transistors) has a drain terminal 341a (an example of a second input drain terminal) configured to form the first top terminal 341, a gate terminal 343a (an example of a second input gate terminal) configured to form the fourth control terminal 343, and a source terminal 345. Transistor 340b (an example of the other of the second pair of transistors) has a drain terminal 342a (an example of a second output drain terminal) configured to form the second bottom terminal 342, a gate terminal 344 (an example of a second output gate terminal), and a source terminal 346. Feedback path 340c is a wire connecting drain terminal 342a to gate terminal 344 to feed back a signal from drain terminal 342a to gate terminal 344. Current source transistor 340d is arranged to provide a bias current to transistors 340a and 340b and has a drain terminal to which both of the source terminals of transistors 340a and 340b are connected, a gate terminal to which a bias voltage is applied by bias voltage source 50, and a source terminal connected to the first voltage supply 30. Active load transistor 340e is arranged to provide a bias current to transistors 340a and 360 and has a drain terminal to which both of the drain terminals of transistors 340a and 360 are connected, a gate terminal to which a bias voltage is applied by bias voltage source 51, and a source terminal connected to the second voltage supply 40. Active load transistor 340f is arranged to provide a bias current to transistors 340b and 350 and has a drain terminal to which both of the drain terminals of transistors 340b and 350 are connected, a gate terminal to which a bias voltage is applied by bias voltage source 52, and a source terminal connected to the second voltage supply 40. As depicted so far, the fourth transconductance unit 340 has a differential pair in which the output signal is fed back to one of its input terminals so that it changes the current flowing from the fourth top terminal 341 to the fourth bottom terminal 342 substantially in proportion to the change of the voltage of the fourth control terminal 343 with respect to the fourth bottom terminal 342.

Transistor 320 has a drain terminal 321 (an example of a second top terminal), a source terminal 322 (an example of a second bottom terminal), and a gate terminal 323 (an example of a second control terminal). Transistor 330 has a drain terminal 331 (an example of a third top terminal), a source terminal 332 (an example of a third bottom terminal), and a gate terminal 333 (an example of a third control terminal). Transistor 350 has a drain terminal 351 (an example of a fifth top terminal), a source terminal 352 (an example of a fifth bottom terminal), and a gate terminal 353 (an example of a fifth control terminal). Transistor 360 has a drain terminal 361 (an example of a sixth top terminal), a source terminal 362 (an example of a sixth bottom terminal), and a gate terminal 363 (an example of a sixth control terminal). Transistors 320 and 350 constitute a differential pair and have matched dimensions. Also, transistors 330 and 360 constitute a differential pair and have matched dimensions. Transistor 320 changes the current flowing from drain terminal 321 to source terminal 322 substantially in proportion to the change of the voltage of gate terminal 323 with respect to source terminal 322, and transistors 330, 350, and 360 work in the same way. Current source transistor 303a is arranged to provide a bias current to transistors 320 and 350 and has a drain terminal which is connected to both of the source terminals of transistors 320 and 350 at node 303c, a gate terminal to which a bias voltage is applied by bias voltage source 303b, and a source terminal connected to the first voltage supply 30. Transistor 304a is arranged to provide a bias current to transistors 330 and 360 and has a drain terminal which is connected to both of the source terminals of transistors 330 and 360 at node 304c, a gate terminal to which a bias voltage is applied by bias voltage source 304b, and a source terminal connected to the first voltage supply 30.

Drain terminal 321 is connected to the first bottom terminal 312 to form the first output node 370. The first output terminal 20 is connected to the first output node 370. Drain terminal 331 is connected to the first top terminal 311 to form the first intermediate node 372. Drain terminal 351 is connected to the fourth bottom terminal 342 to form the second output node 371. The second output terminal 21 is connected to the second output node 371. Drain terminal 361 is connected to the fourth top terminal 341 to form the second intermediate node 373. The first connector 380 is configured to connect gate terminal 323 to the first intermediate node 372 and has capacitors 380a and 380b and a bias voltage source 380c. Capacitor 380a has a terminal connected to the first intermediate node 372 and another terminal on the other side connected to gate terminal 323. Capacitor 380b is connected to capacitor 380a in series and has a terminal connected to capacitor 380a and gate terminal 323 and another terminal on the other side connected to bias voltage source 380c. Bias voltage source 380c is arranged to provide a quiescent bias voltage to gate terminal 323. The second connector 381 is configured to connect gate terminal 353 to the second intermediate node 373 and has capacitors 381a and 381b and a bias voltage source 381c. Capacitor 381a has a terminal connected to the second intermediate node 373 and another terminal on the other side connected to gate terminal 353. Capacitor 381b is connected to capacitor 381a in series and has a terminal connected to capacitor 381a and gate terminal 353 and another terminal on the other side connected to bias voltage source 381c. Bias voltage source 381c is arranged to provide a quiescent bias voltage to gate terminal 353. The third connector 382 is configured to connect gate terminal 333 to the second intermediate node 373 and has capacitors 382a and 382b and a bias voltage source 382c. Capacitor 382a has a terminal connected to the second intermediate node 373 and another terminal on the other side connected to gate terminal 333. Capacitor 382b is connected to capacitor 382a in series and has a terminal connected to capacitor 382a and gate terminal 333 and another terminal on the other side connected to bias voltage source 382c. Bias voltage source 382c is arranged to provide a quiescent bias voltage to gate terminal 333. The fourth connector 383 is configured to connect gate terminal 363 to the first intermediate node 372 and has capacitors 383a and 383b and a bias voltage source 383c. Capacitor 383a has a terminal connected to the first intermediate node 372 and another terminal on the other side connected to gate terminal 363. Capacitor 383b is connected to capacitor 383a in series and has a terminal connected to capacitor 383a and gate terminal 363 and another terminal on the other side connected to bias voltage source 383c. Bias voltage source 383c is arranged to provide a quiescent bias voltage to gate terminal 363.

The first input terminal 10 is connected to the first control terminal 313, and the second input terminal 11 is connected to the fourth control terminal 343. Diode connected transistor 300 and capacitor 390 are connected in series and connect the first output node 370 to node 302c, and diode connected transistor 301 and capacitor 391 are connected in series and connect the second output node 371 to node 302c. Diode connected transistor 300 has a transistor 300a, and transistor 300a has a drain terminal, a gate terminal connected to the drain terminal of transistor 300a and capacitor 390, and a source terminal connected to node 302c. Diode connected transistor 301 has a transistor 301a, and transistor 301a has a drain terminal, a gate terminal connected to the drain terminal of transistor 301a and capacitor 391, and a source terminal connected to node 302c. Node 302c can be seen as a virtual ground because its voltage is relatively constant in relation to a differential signal. Active load transistor 300b is arranged to provide a bias current to transistor 300a and has a drain terminal to which both of the drain and gate terminals of transistor 300a are connected, a gate terminal to which a bias voltage is applied by bias voltage source 53, and a source terminal connected to the second voltage supply 40. Active load transistor 301b is arranged to provide a bias current to transistor 301a and has a drain terminal to which both of the drain and gate terminals of transistor 301b are connected, a gate terminal to which a bias voltage is applied by bias voltage source 53, and a source terminal connected to the second voltage supply 40. Transistors 300a and 301a constitute a differential pair and have matched dimensions. Current source transistor 302a is arranged to provide a bias current to transistors 300a and 301a and has a drain terminal to which both of the source terminals of transistors 300a and 301a are connected, a gate terminal to which a bias voltage is applied by bias voltage source 302b, and a source terminal connected to the first voltage supply 30. Capacitors 392a and 392b are connected in series and connect the first output node 370 to the first voltage supply 30. Capacitors 392c and 392d are connected in series and connect the first output node 370 to the first voltage supply 30. Four capacitors 392a to 392d are provided to adjust the capacitance associated with the first output node 370 so that resonance occurs. In this embodiment, capacitors 392a to 392d have the same capacitances as capacitors 380a, 380b, 382a, and 382b, respectively. Capacitors 393a and 393b are connected in series and connect the second output node 371 to the first voltage supply 30. Capacitors 393c and 393d are connected in series and connect the second output node 371 to the first voltage supply 30. Four capacitors 393a to 393d are provided to adjust the capacitance associated with the second output node 371 so that resonance occurs. In this embodiment, capacitors 393a to 393d have the same capacitances as capacitors 381a, 381b, 383a, and 383b, respectively.

Other Embodiments

The transconductances, resistances, and capacitances of the components are chosen so that resonance occurs, and the relationship among them can be expressed using values such as the ratios of transconductances to each other, the product of a resistance and a transconductance, and the ratios of capacitances to each other. The transconductances of transistors can vary depending on variations in semiconductor manufacturing process, device temperature etc., but the ratios of them can be controlled by
laying out transistors in a matched manner. The differential pairs of transistors 310a and 310b, transistors 320 and 350, transistors 330 and 360, transistors 340a and 340b, and transistors 300a and 301a can be laid out in a matched way so that the ratio of the transconductances of the transistors in one differential pair to
the transconductances of the transistors in another differential pair can substantially remain unchanged despite fluctuations such as process variations. In the preceding embodiment, the first to fourth connectors 380 to 383 work as voltage dividers, and fractions of the signals applied to the capacitors 380a, 381a, 382a, and 383a are transferred to gate terminals 323, 353, 333, and 363, respectively. The effects of voltage dividing by these connectors are substantially equivalent to scaling the transconductances of transistors 320, 330, 350 and 360. In the third embodiment, resonator circuit 3 is designed so that transistors 310a, 310b, 320, 330, 340a, 340b, 350, and 360 have the same size, so that current source transistors 303a, 304a, 310d, and 340d have the same size, and so that bias voltage sources 50, 303b, and 304b supplies the same voltage. Also, transistors 300a and 301a are designed to have an integer multiple of size of transistors 310a and 310b, and current source transistor 302a has the integer multiple of size of transistor 310d, but bias voltage source 302b supplies the same voltage as bias voltage source 50 so that the transconductances of transistors 300a and 301a are an integer multiple of those of transistors 310a and 310b. This information about transistor sizes and bias voltages serves as just an example, and they are not limited to those which have been presented in the foregoing embodiments.

Figure 5:
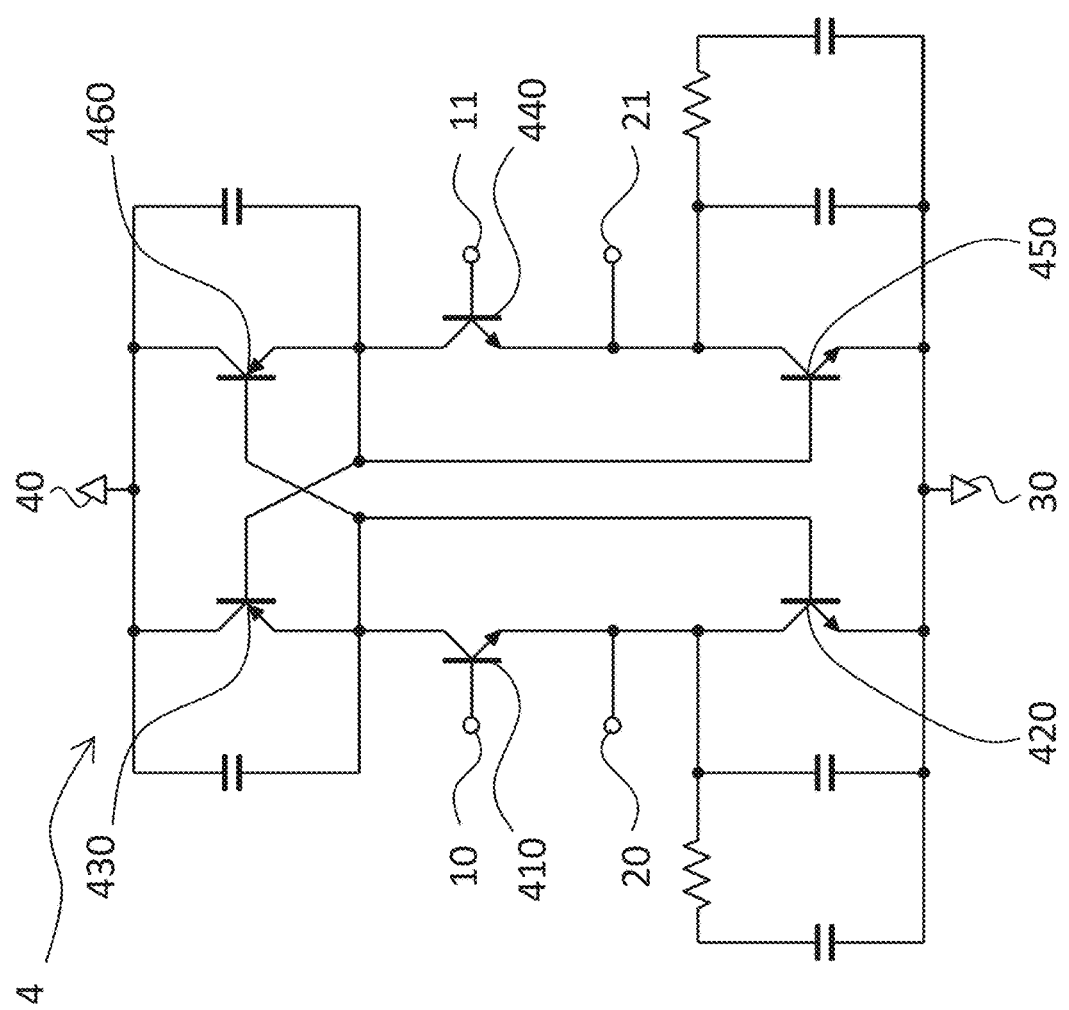
FIG. 5 is a diagram of resonator circuit 4

There are various kinds of modifications and replacements allowed to be made in the foregoing embodiments. The transistors in the embodiments are not necessarily limited to MOS type transistors or field effect transistors (FET), and bipolar type transistors may be used for all or part of them, for example. Resonator 4 in FIG. 5 has an npn type transistor 410 (an example of the a first transconductance unit), an npn
type transistor 420 (an example of a second transconductance unit), a pnp type transistor 430 (an example of a third transconductance unit), an npn type transistor 440 (an example of a fourth transconductance unit),
an npn type transistor 450 (an example of a fifth transconductance unit), and a pnp type transistor 460 (an example of a sixth transconductance unit). The changes in base-emitter voltages of transistors 410 to 460 are not too large, and it can be regarded that the change in a current flowing from the collector terminal to the emitter terminal is substantially in proportion to the change of the base-emitter voltage in each of the transistors 410 to 460. Note that bias circuits for resonator 4 are omitted in FIG. 5.

The roles of the first to fourth connectors are to form a path for signals from one node to another node, and any type of connectors may be used as long as the intended function of the invention can be carried out. The connectors can be a voltage follower such as a source follower or a voltage divider using resistors instead of a mere wire or instead of a voltage divider using capacitors as shown in the foregoing embodiments. The first and second feedback paths do not need to be a mere wire and can be, for example, a voltage follower such as a source follower. The feedback paths may also be a voltage divider that is arranged in the same way as connectors 380, 381, 382, and 383, in order to apply a part of the signal at the first and second output nodes 370 and 371 to gate nodes 314 and 344, respectively. When voltage dividers are used for feedback paths 310c and 340c, resonator 3 will have a DC gain larger than 0 dB. The first and second resistive elements are to behave like a resistor and conduct a current substantially proportional to the voltage across its two terminals at least over a certain range of frequencies and amplitudes of the input voltage. The first and second resistive elements, therefore, may be a device other than a resistor or diode connected transistor as long as it serves the intended purpose. Or, the first and second resistive elements can be omitted when the second zero is not necessary.

What is claimed is:

1. A resonator circuit, comprising:

a first transconductance unit having a first top terminal, a first bottom terminal, and a first control terminal, and configured to change the current flowing from the first top terminal to the first bottom terminal substantially in proportion to the change of the voltage of the first control terminal with respect to the first bottom terminal;

a second transconductance unit having a second top terminal connected to the first bottom terminal to form a first output node, a second bottom terminal, and a second control terminal, and configured to change the current flowing from the second top terminal to the second bottom terminal substantially in proportion to the change of the voltage of the second control terminal with respect to the second bottom terminal;

a third transconductance unit having a third top terminal connected to the first top terminal to form a first intermediate node, a third bottom terminal, and a third control terminal, and configured to change the current flowing from the third top terminal to the third bottom terminal substantially in proportion to the change of the voltage of the third control terminal with respect to the third bottom terminal;

a fourth transconductance unit having a fourth top terminal, a fourth bottom terminal, and a fourth control terminal, and configured to change the current flowing from the fourth top terminal to the fourth bottom terminal substantially in proportion to the change of the voltage of the fourth control terminal with respect to the fourth bottom terminal;

a fifth transconductance unit having a fifth top terminal connected to the fourth bottom terminal to form a second output node, a fifth bottom terminal, and a fifth control terminal, and configured to change the current flowing from the fifth top terminal to the fifth bottom terminal substantially in proportion to the change of the voltage of the fifth control terminal with respect to the fifth bottom terminal;

a sixth transconductance unit having a sixth top terminal connected to the fourth top terminal to form a second intermediate node, a sixth bottom terminal, and a sixth control terminal, and configured to change the current flowing from the sixth top terminal to the sixth bottom terminal substantially in proportion to the change of the voltage of the sixth control terminal with respect to the sixth bottom terminal;

a first connector configured to connect the second control terminal to the first intermediate node;
a second connector configured to connect the fifth control terminal to the second intermediate node;
a third connector configured to connect the third control terminal to the second intermediate node;
a fourth connector configured to connect the sixth control terminal to the first intermediate node;
a first resistive element and a first capacitive element connected in series configured to connect the first output node to a virtual ground; and
a second resistive element and a second capacitive element connected in series configured to connect the second output node to a virtual ground.

2. A resonator circuit, comprising:

a first transconductance unit having a first top terminal, a first bottom terminal, and a first control terminal, and configured to change the current flowing from the first top terminal to the first bottom terminal substantially in proportion to the change of the voltage of the first control terminal with respect to the first bottom terminal;

a second transconductance unit having a second top terminal connected to the first bottom terminal to form a first output node, a second bottom terminal, and a second control terminal, and configured to change the current flowing from the second top terminal to the second bottom terminal substantially in proportion to the change of the voltage of the second control terminal with respect to the second bottom terminal;

a third transconductance unit having a third top terminal connected to the first top terminal to form a first intermediate node, a third bottom terminal, and a third control terminal, and configured to change the current flowing from the third top terminal to the third bottom terminal substantially in proportion to the change of the voltage of the third control terminal with respect to the third bottom terminal;

a fourth transconductance unit having a fourth top terminal, a fourth bottom terminal, and a fourth control terminal, and configured to change the current flowing from the fourth top terminal to the fourth bottom terminal substantially in proportion to the change of the voltage of the fourth control terminal with respect to the fourth bottom terminal;

a fifth transconductance unit having a fifth top terminal connected to the fourth bottom terminal to form a second output node, a fifth bottom terminal, and a fifth control terminal, and configured to change the current flowing from the fifth top terminal to the fifth bottom terminal substantially in proportion to the change of the voltage of the fifth control terminal with respect to the fifth bottom terminal;

a sixth transconductance unit having a sixth top terminal connected to the fourth top terminal to form a second intermediate node, a sixth bottom terminal, and a sixth control terminal, and configured to change the current flowing from the sixth top terminal to the sixth bottom terminal substantially in proportion to the change of the voltage of the sixth control terminal with respect to the sixth bottom terminal;

a first connector configured to connect the second control terminal to the first intermediate node;
a second connector configured to connect the fifth control terminal to the second intermediate node;
a third connector configured to connect the third control terminal to the second intermediate node; and
a fourth connector configured to connect the sixth control terminal to the first intermediate node, wherein
the first transconductance unit includes:
a first pair of transistors, one of the first pair of transistors having a first input drain terminal configured to form the first top terminal and a first input gate terminal configured to form the first control terminal, the other of the first pair of transistors having a first output drain terminal configured to form the first bottom terminal and a first output gate terminal; and
a first feedback path configured to feed back a signal from the first output drain terminal to the first output gate terminal; and wherein
the fourth transconductance unit includes:
a second pair of transistors, one of the second pair of transistors having a second input drain terminal configured to form the fourth top terminal and a second input gate terminal configured to form the fourth control terminal, the other of the second pair of transistors having a second output drain terminal configured to form the fourth bottom terminal and a second output gate terminal; and
a second feedback path configured to feed back a signal from the second output drain terminal to the second output gate terminal.

* * * * *